United States Patent
Hsu et al.

(10) Patent No.: US 8,216,685 B2
(45) Date of Patent: *Jul. 10, 2012

(54) BUFFER BILAYERS FOR ELECTRONIC DEVICES

(75) Inventors: Che-Hsiung Hsu, Wilmington, DE (US); Chi Zhang, Goleta, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/466,879

(22) Filed: May 15, 2009

(65) Prior Publication Data

US 2011/0042688 A1 Feb. 24, 2011

Related U.S. Application Data

(60) Provisional application No. 61/053,692, filed on May 16, 2008.

(51) Int. Cl.
*B32B 15/04* (2006.01)

(52) U.S. Cl. ......................... 428/457; 428/461; 428/462

(58) Field of Classification Search .................. 428/457, 428/461, 462
See application file for complete search history.

(56) References Cited

U.S. PATENT DOCUMENTS

| | | | |
|---|---|---|---|
| 3,282,875 A | 11/1966 | Connolly et al. | |
| 4,358,545 A | 11/1982 | Ezzell et al. | |
| 4,795,543 A | 1/1989 | Stetter et al. | |
| 4,940,525 A | 7/1990 | Ezzell et al. | |
| 5,463,005 A | 10/1995 | Desmarteau | |
| 6,150,426 A | 11/2000 | Curtin et al. | |
| 6,210,790 B1 | 4/2001 | Crivello | |
| 6,303,238 B1 | 10/2001 | Thompson et al. | |
| 6,337,370 B1 | 1/2002 | Bae et al. | |
| 6,551,725 B2 | 4/2003 | Raychaudhuri et al. | |
| 6,670,645 B2 | 12/2003 | Grushin et al. | |
| 7,112,369 B2 | 9/2006 | Wang et al. | |
| 7,166,010 B2 | 1/2007 | Lamansky et al. | |
| 7,244,797 B2 | 7/2007 | Kurihara | |
| 2001/0038937 A1 | 11/2001 | Suzuki et al. | |
| 2003/0020073 A1 | 1/2003 | Long et al. | |
| 2004/0102577 A1 | 5/2004 | Hsu et al. | |
| 2004/0127637 A1 | 7/2004 | Hsu et al. | |
| 2005/0205860 A1 | 9/2005 | Hsu et al. | |
| 2005/0209392 A1 | 9/2005 | Luo et al. | |
| 2006/0188745 A1* | 8/2006 | Liao et al. ..................... 428/690 |
| 2006/0234088 A1 | 10/2006 | Inoue | |
| 2006/0289843 A1 | 12/2006 | Hsu et al. | |
| 2006/0292362 A1* | 12/2006 | Hsu et al. ..................... 428/323 |
| 2007/0096082 A1 | 5/2007 | Gaynor et al. | |
| 2007/0298530 A1 | 12/2007 | Feehery | |

FOREIGN PATENT DOCUMENTS

| | | |
|---|---|---|
| EP | 1026152 B1 | 7/2006 |
| WO | 9831716 A1 | 7/1998 |
| WO | 9952954 A1 | 10/1999 |
| WO | WO00/70655 | 11/2000 |
| WO | WO01/41512 A1 | 6/2001 |
| WO | 03006537 A1 | 1/2003 |
| WO | WO03/008424 A1 | 1/2003 |
| WO | WO03/040257 A1 | 5/2003 |
| WO | WO03/063555 A1 | 7/2003 |
| WO | WO03/091688 A2 | 11/2003 |
| WO | WO2004/016710 A1 | 2/2004 |
| WO | 2004105150 A1 | 12/2004 |
| WO | 2007120143 A1 | 10/2007 |

OTHER PUBLICATIONS

CRC Handbook of Chemistry and Physics, 81st Edition (2000-2001) (Book Not Included).
Kirk-Othmer Encyclopedia of Chemical Technology, Fourth Edition, vol. 18, p. 837-860, 1996, by Y. Wang.
"Flexible light-emitting diodes made from soluble conducting polymer," Gustafsson et al, Nature vol. 357, pp. 477 479 (Jun. 11, 1992).
A Feiring et al, J Fluorine Chemistry 2000, 105, 129-135.
D D Desmarteau, J Fluorine Chemistry, 1995, 72, 203-208.
A J Appleby et al, J Electrochem. Soc. 1993, 140(1), 109-111.
Macromolecules 2000, 33, 9262-9271.
Macromolecules 2001, 34, 5746-5747.
Macromolecules, 2002, 35, 7281-7286.
Baytron H. C. Stark GmbH (Brochure) No date.
Iijima et al.—Single-Shell Carbon Nanotubes of 1-nm Diameter 1993 vol. 363 pp. 603-605.
Ivanov et al, The Study of Carbon Nanotubules Produced by Catalytic Method, Chem. Phys. Lett. 1994, vol. 223 pp. 329-335.
Journet et al.—Large-Scale Production of Single-Walled Carbon Nanotubes by the Electric-Arc Technique, Nature, 1997 vol. 388 pp. 756-758.
Li et al—Large-Scale Synthesis of Aligned Carbon Nanotubes, Science, 1996 vol. 274 pp. 1701-1703.
Thess et al., Crystalline Ropes of Metallic Carbon Nanotubes, Science, 1996 vol. 273 pp. 483-487.
Wu et al, Transparent, Conductive Carbon Nanotube Files, Science, 2004, vol. 305, pp. 1273-1276.

* cited by examiner

*Primary Examiner* — Edward Cain

(57) ABSTRACT

The present invention relates to buffer bilayers, and their use in electronic devices. The bilayer has a first layer including (i) at least one electrically conductive polymer doped with at least one non-fluorinated polymeric acid and (ii) at least one highly-fluorinated acid polymer. The bilayer has a second layer including a metal which can be one or more transition metals, Group 13 metals, Group 14 metals, or lanthanide metals.

16 Claims, 1 Drawing Sheet

BUFFER BILAYERS FOR ELECTRONIC DEVICES

RELATED APPLICATION

This application claims priority under 35 U.S.C. §119(e) from U.S. Provisional Application No. 61/053,692 filed on May 16, 2008 which is incorporated by reference in its entirety.

BACKGROUND INFORMATION

1. Field of the Disclosure

This disclosure relates in general to buffer bilayers and their use in electronic devices.

2. Description of the Related Art

Electronic devices define a category of products that include an active layer. Organic electronic devices have at least one organic active layer. Such devices convert electrical energy into radiation such as light emitting diodes, detect signals through electronic processes, convert radiation into electrical energy, such as photovoltaic cells, or include one or more organic semiconductor layers.

Organic light-emitting diodes (OLEDs) are an organic electronic device comprising an organic layer capable of electroluminescence. OLEDs containing conducting polymers can have the following configuration:

anode/buffer layer/EL material/cathode with additional layers between the electrodes. The anode is typically any material that has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material. Electrically conducting polymers having low conductivity in the range of $10^{-3}$ to $10^{-7}$ S/cm are commonly used as the buffer layer in direct contact with an electrically conductive anode, such as ITO.

There is a continuing need for improved buffer layers.

SUMMARY

There is provided a buffer bilayer comprising:

a first layer comprising (i) at least one electrically conductive polymer doped with at least one non-fluorinated polymeric acid and (ii) at least one highly-fluorinated acid polymer, and a second layer comprising a layer of a metal selected from the group consisting of transition metals, Group 13 metals, Group 14 metals, and lanthanide metals.

In another embodiment, electronic devices comprising at least one buffer bilayer are provided.

BRIEF DESCRIPTION OF THE DRAWINGS

The invention is illustrated by way of example and not limitation in the accompanying figures.

Figure 1:
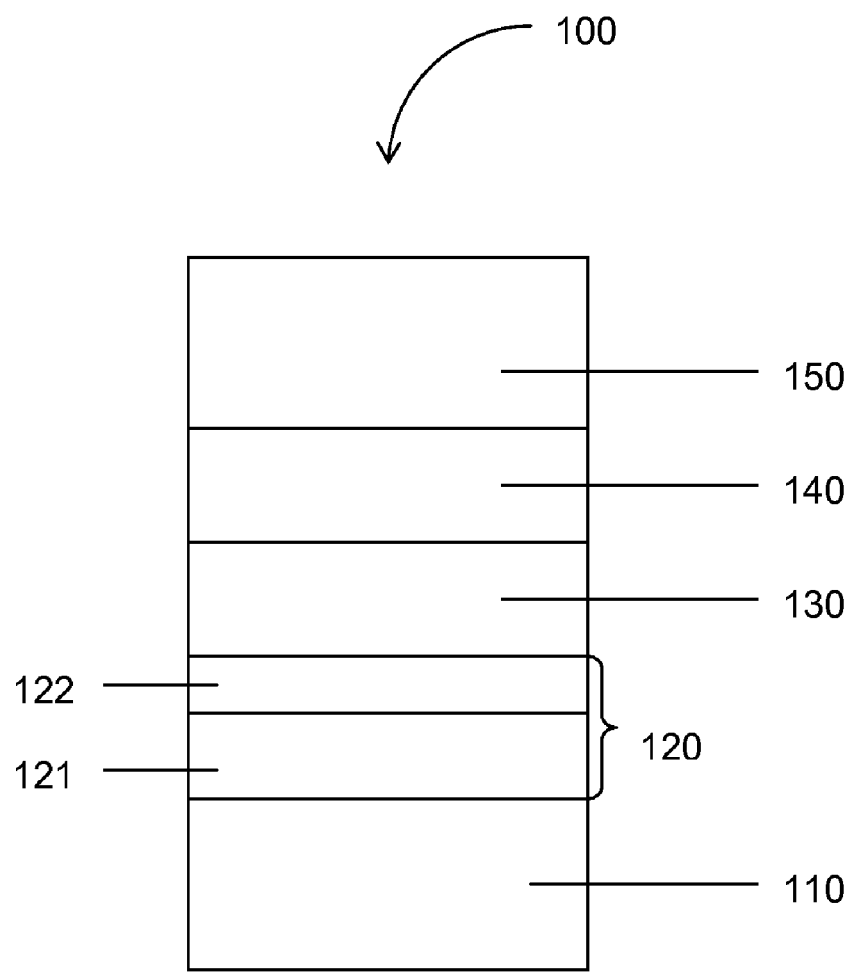
FIG. 1 is a schematic diagram of an organic electronic device.

Skilled artisans will appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are described herein and are merely exemplary and not limiting. After reading this specification, skilled artisans will appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the First Layer of the Buffer Bilayer, the Second Layer of the Buffer Bilayer, the Formation of the Buffer Bilayer, Electronic Devices, and finally, Examples.

1. Definitions and Clarification of Terms

Before addressing details of embodiments described below, some terms are defined or clarified.

The term "buffer layer" or "buffer material" is intended to refer to electrically conductive or semiconductive layers or materials which may have one or more functions in an organic electronic device, including but not limited to, planarization of the underlying layer, charge transport and/or charge injection properties, scavenging of impurities such as oxygen or metal ions, and other aspects to facilitate or to improve the performance of an organic electronic device.

The term "conductor" and its variants are intended to refer to a layer material, member, or structure having an electrical property such that current flows through such layer material, member, or structure without a substantial drop in potential. The term is intended to include semiconductors. In some embodiments, a conductor will form a layer having a conductivity of at least $10^{-7}$ S/cm.

The term "electrically conductive" as it refers to a material, is intended to mean a material which is inherently or intrinsically capable of electrical conductivity without the addition of carbon black or conductive metal particles.

The term "polymer" is intended to mean a material having at least one repeating monomeric unit. The term includes homopolymers having only one kind, or species, of monomeric unit, and copolymers having two or more different monomeric units, including copolymers formed from monomeric units of different species.

The term "acid polymer" refers to a polymer having acidic groups.

The term "acidic group" refers to a group capable of ionizing to donate a hydrogen ion to a Brønsted base.

The term "highly-fluorinated" refers to a compound in which at least 90% of the available hydrogens bonded to carbon have been replaced by fluorine.

The terms "fully-fluorinated" and "perfluorinated" are used interchangeably and refer to a compound where all of the available hydrogens bonded to carbon have been replaced by fluorine.

The term "non-fluorinated" refers to a compound in which less than 25% of the available hydrogens bonded to carbon have been replaced by fluorine.

The term "doped" as it refers to an electrically conductive polymer, is intended to mean that the electrically conductive polymer has a polymeric counterion to balance the charge on the conductive polymer.

The term "doped conductive polymer" is intended to mean the conductive polymer and the polymeric counterion that is associated with it.

The term "layer" is used interchangeably with the term "film" and refers to a coating covering a desired area. The term is not limited by size. The area can be as large as an entire device or as small as a specific functional area such as the actual visual display, or as small as a single sub-pixel. Unless otherwise indicated, layers and films can be formed by any conventional deposition technique, including vapor deposition, liquid deposition (continuous and discontinuous techniques), and thermal transfer.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "electron transport" means when referring to a layer, material, member or structure, such a layer, material, member or structure that promotes or facilitates migration of negative charges through such a layer, material, member or structure into another layer, material, member or structure.

Although light-emitting materials may also have some charge transport properties, the terms "hole transport layer, material, member, or structure" and "electron transport layer, material, member, or structure" are not intended to include a layer, material, member, or structure whose primary function is light emission.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. In the Formulae, the letters Q, R, T, W, X, Y, and Z are used to designate atoms or groups which are defined within. All other letters are used to designate conventional atomic symbols. Group numbers corresponding to columns within the Periodic Table of the elements use the "New Notation" convention as seen in the *CRC Handbook of Chemistry and Physics*, 81$^{st}$ Edition (2000).

To the extent not described herein, many details regarding specific materials, processing acts, and circuits are conventional and may be found in textbooks and other sources within the organic light-emitting diode display, lighting source, photodetector, photovoltaic, and semiconductive member arts.

2. First Layer of the Buffer Bilayer

The first layer comprises (i) a conductive polymer doped with at least one non-fluorinated polymeric acid and (ii) at least one highly-fluorinated acid polymer. In the following discussion, the conductive polymer, non-fluorinated polymeric acid, and highly-fluorinated acid polymer will be referred to in the singular. However, it is understood that more than one of any or all of these may be used.

a. Electrically Conductive Polymer

Any electrically conductive polymer can be used in the new composition. In some embodiments, the electrically conductive polymer will form a film which has a conductivity greater than $10^{-7}$ S/cm.

The conductive polymers suitable for the new composition are made from at least one monomer which, when polymerized alone, forms an electrically conductive homopolymer. Such monomers are referred to herein as "conductive precursor monomers." Monomers which, when polymerized alone form homopolymers which are not electrically conductive, are referred to as "non-conductive precursor monomers." The conductive polymer can be a homopolymer or a copolymer. Conductive copolymers suitable for the new composition can be made from two or more conductive precursor monomers or from a combination of one or more conductive precursor monomers and one or more non-conductive precursor monomers.

In some embodiments, the conductive polymer is made from at least one conductive precursor monomer selected from thiophenes, pyrroles, anilines, and polycyclic aromatics. The term "polycyclic aromatic" refers to compounds having more than one aromatic ring. The rings may be joined by one or more bonds, or they may be fused together.

The term "aromatic ring" is intended to include heteroaromatic rings. A "polycyclic heteroaromatic" compound has at least one heteroaromatic ring.

In some embodiments, the conductive polymer is made from at least one precursor monomer selected from thiophenes, selenophenes, tellurophenes, pyrroles, anilines, and polycyclic aromatics. The polymers made from these monomers are referred to herein as polythiophenes, poly(selenophenes), poly(tellurophenes), polypyrroles, polyanilines, and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In some embodiments, the polycyclic aromatic polymers are poly(thienothiophenes).

In some embodiments, monomers contemplated for use to form the electrically conductive polymer in the new composition comprise Formula I below:

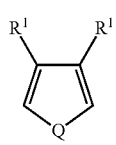

(I)

wherein:

Q is selected from the group consisting of S, Se, and Te;

$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

As used herein, the following terms for substituent groups refer to the formulae given below:

"alcohol" —$R^3$—OH
"amido" —$R^3$—C(O)N($R^6$)$R^6$
"amidosulfonate" —$R^3$—C(O)N($R^6$)$R^4$—$SO_3Z$
"benzyl" —$CH_2$—$C_6H_5$
"carboxylate" —$R^3$—C(O)O—Z or —$R^3$—O—C(O)—Z
"ether" —$R^3$—(O—$R^5$)$_p$—O—$R^5$
"ether carboxylate" —$R^3$—O—$R^4$—C(O)O—Z or —$R^3$—O—$R^4$—O—C(O)—Z
"ether sulfonate" —$R^3$—O—$R^4$—$SO_3Z$
"ester sulfonate" —$R^3$—O—C(O)—$R^4$—$SO_3Z$
"sulfonimide" —$R^3$—$SO_2$—NH—$SO_2$—$R^5$
"urethane" —$R^3$—O—C(O)—N($R^6$)$_2$ where all "R" groups are the same or different at each occurrence and:
$R^3$ is a single bond or an alkylene group
$R^4$ is an alkylene group
$R^5$ is an alkyl group
$R^6$ is hydrogen or an alkyl group
p is 0 or an integer from 1 to 20
Z is H, alkali metal, alkaline earth metal, N($R^5$)$_4$ or $R^5$ Any of the above groups may further be unsubstituted or substituted, and any group may have F substituted for one or more hydrogens, including perfluorinated groups. In some embodiments, the alkyl and alkylene groups have from 1-20 carbon atoms.

In some embodiments, in the monomer, both $R^1$ together form —W—(C$Y^1Y^2$)$_m$—W—, where m is 2 or 3, W is O, S, Se, PO, N$R^6$, $Y^1$ is the same or different at each occurrence and is hydrogen or fluorine, and $Y^2$ is the same or different at each occurrence and is selected from hydrogen, halogen, alkyl, alcohol, amidosulfonate, benzyl, carboxylate, ether, ether carboxylate, ether sulfonate, ester sulfonate, and urethane, where the Y groups may be partially or fully fluorinated. In some embodiments, all Y are hydrogen. In some embodiments, the polymer is poly(3,4-ethylenedioxythiophene). In some embodiments, at least one Y group is not hydrogen. In some embodiments, at least one Y group is a substituent having F substituted for at least one hydrogen. In some embodiments, at least one Y group is perfluorinated.

In some embodiments, the monomer has Formula I(a):

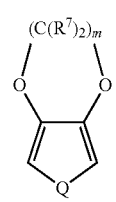

(Ia)

wherein:
Q is selected from the group consisting of S, Se, and Te;
$R^7$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^7$ is not hydrogen, and
m is 2 or 3.

In some embodiments of Formula I(a), m is two, one $R^7$ is an alkyl group of more than 5 carbon atoms, and all other $R^7$ are hydrogen. In some embodiments of Formula I(a), at least one $R^7$ group is fluorinated. In some embodiments, at least one $R^7$ group has at least one fluorine substituent. In some embodiments, the $R^7$ group is fully fluorinated.

In some embodiments of Formula I(a), the $R^7$ substituents on the fused alicyclic ring on the monomer offer improved solubility of the monomers in water and facilitate polymerization in the presence of the fluorinated acid polymer.

In some embodiments of Formula I(a), m is 2, one $R^7$ is sulfonic acid-propylene-ether-methylene and all other $R^7$ are hydrogen. In some embodiments, m is 2, one $R^7$ is propyl-ether-ethylene and all other $R^7$ are hydrogen. In some embodiments, m is 2, one $R^7$ is methoxy and all other $R^7$ are hydrogen. In some embodiments, one $R^7$ is sulfonic acid difluoromethylene ester methylene (—$CH_2$—O—C(O)—$CF_2$—$SO_3H$), and all other $R^7$ are hydrogen.

In some embodiments, pyrrole monomers contemplated for use to form the electrically conductive polymer in the new composition comprise Formula II below.

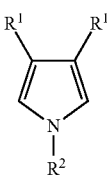

(II)

where in Formula II:
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and $R^2$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In some embodiments, $R^1$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In some embodiments, $R^2$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In some embodiments, the pyrrole monomer is unsubstituted and both $R^1$ and $R^2$ are hydrogen.

In some embodiments, both $R^1$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In some embodiments, both $R^1$ together form a 6- or 7-membered alicyclic ring, which is further substituted with an alkyl group. In some embodiments, both $R^1$ together form a 6- or 7-membered alicyclic ring, which is further substituted with an alkyl group having at least 1 carbon atom.

In some embodiments, both $R^1$ together form —O—(CHY)$_m$—O—, where m is 2 or 3, and Y is the same or different at each occurrence and is selected from hydrogen, alkyl, alcohol, benzyl, carboxylate, amidosulfonate, ether, ether carboxylate, ether sulfonate, ester sulfonate, and urethane. In some embodiments, at least one Y group is not hydrogen. In some embodiments, at least one Y group is a substituent having F substituted for at least one hydrogen. In some embodiments, at least one Y group is perfluorinated.

In some embodiments, aniline monomers contemplated for use to form the electrically conductive polymer in the new composition comprise Formula III below.

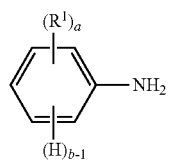

(III)

wherein:
a is 0 or an integer from 1 to 4;
b is an integer from 1 to 5, with the proviso that a+b=5; and
$R^1$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^1$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula IV(a) or Formula IV(b) shown below, or a combination of both formulae.

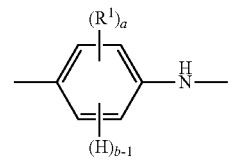

IV(a)

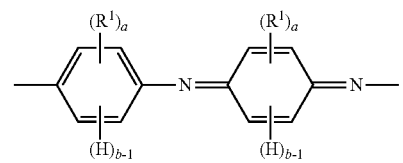

IV(b)

where a, b and $R^1$ are as defined above.

In some embodiments, the aniline monomer is unsubstituted and a=0.

In some embodiments, a is not 0 and at least one $R^1$ is fluorinated. In some embodiments, at least one $R^1$ is perfluorinated.

In some embodiments, fused polycyclic heteroaromatic monomers contemplated for use to form the electrically conductive polymer in the new composition have two or more fused aromatic rings, at least one of which is heteroaromatic. In some embodiments, the fused polycyclic heteroaromatic monomer has Formula V:

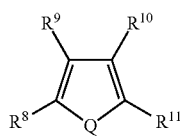

(V)

wherein:
Q is S, Se, Te, or NR$^6$;
R$^6$ is hydrogen or alkyl;
R$^8$, R$^9$, R$^{10}$, and R$^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur, selenium, tellurium, or oxygen atoms.

In some embodiments, the fused polycyclic heteroaromatic monomer has a formula selected from the group consisting of Formula V(a), V(b), V(c), V(d), V(e), V(f), V(g), V(h), V(i), V(j), and V(k):

(Va)

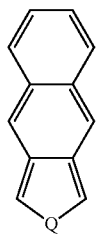

(Vb)

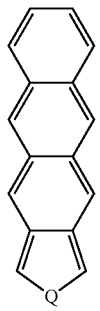

(Vc)

(Vd)

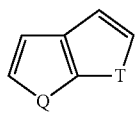

(Ve)

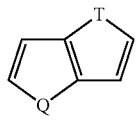

(Vf)

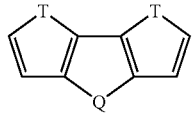

(Vg)

(Vh)

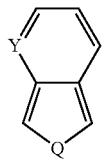

(Vi)

(Vj)

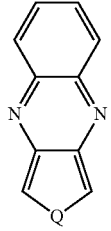

(Vk)

wherein:
Q is S, Se, Te, or NH; and
T is the same or different at each occurrence and is selected from S, $NR^6$, O, $SiR^6_2$, Se, Te, and $PR^6$;
Y is N; and
$R^6$ is hydrogen or alkyl.

The fused polycyclic heteroaromatic monomers may be further substituted with groups selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

In some embodiments, the fused polycyclic heteroaromatic monomer is a thieno(thiophene). Such compounds have been discussed in, for example, Macromolecules, 34, 5746-5747 (2001); and Macromolecules, 35, 7281-7286 (2002). In some embodiments, the thieno(thiophene) is selected from thieno(2,3-b)thiophene, thieno(3,2-b)thiophene, and thieno(3,4-b)thiophene. In some embodiments, the thieno(thiophene) monomer is further substituted with at least one group selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

In some embodiments, polycyclic heteroaromatic monomers contemplated for use to form the polymer in the new composition comprise Formula VI:

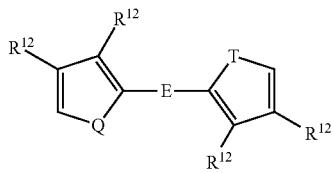
(VI)

wherein:

Q is S, Se, Te, or $NR^6$;

T is selected from S, $NR^6$, O, $SiR^6_2$, Se, Te, and $PR^6$;

E is selected from alkenylene, arylene, and heteroarylene;

$R^6$ is hydrogen or alkyl;

$R^{12}$ is the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In some embodiments, the electrically conductive polymer is a copolymer of a precursor monomer and at least one second monomer. Any type of second monomer can be used, so long as it does not detrimentally affect the desired properties of the copolymer. In some embodiments, the second monomer comprises no more than 50% of the polymer, based on the total number of monomer units. In some embodiments, the second monomer comprises no more than 30%, based on the total number of monomer units. In some embodiments, the second monomer comprises no more than 10%, based on the total number of monomer units.

Exemplary types of second monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In some embodiments, the copolymers are made by first forming an intermediate precursor monomer having the structure A-B-C, where A and C represent precursor monomers, which can be the same or different, and B represents a second monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In some embodiments, the electrically conductive polymer is selected from the group consisting of a polythiophene, a polypyrrole, a polymeric fused polycyclic heteroaromatic, a copolymer thereof, and combinations thereof.

In some embodiments, the electrically conductive polymer is selected from the group consisting of poly(3,4-ethylenedioxythiophene), unsubstituted polypyrrole, poly(thieno(2,3-b)thiophene), poly(thieno(3,2-b)thiophene), and poly(thieno(3,4-b)thiophene).

b. Non-Fluorinated Polymeric Acid

Any non-fluorinated polymeric acid, which is capable of doping the conductive polymer can be used. In some embodiments, the non-fluorinated polymeric acid has less than 10% of the available hydrogens bonded to carbon replaced with fluorine. In some embodiments, there is no fluorine.

The use of such acids with conducting polymers such as polythiophenes, polyanilines and polypyrroles is well known in the art. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group.

In one embodiment, the acid is a non-fluorinated polymeric sulfonic acid. Some non-limiting examples of the acids are poly(styrenesulfonic acid) ("PSSA"), poly(2-acrylamido-2-methyl-1-propanesulfonic acid) ("PAAMPSA"), and mixtures thereof.

The amount of non-fluorinated polymeric acid present is generally in excess of that required to counterbalance the charge on the conducting polymer. In some embodiments, the ratio of acid equivalents of non-fluorinated polymeric acid to molar equivalents of conducting polymer is in the range of 1-5.

c. Preparation of Doped Electrically Conductive Polymer

The doped electrically conductive polymer is formed by oxidative polymerization of the precursor monomer in the presence of the non-fluorinated polymeric acid in an aqueous medium. Oxidative polymerization of such monomers is well known. Oxidants such as sodium or potassium persulfate may be used. In some cases a catalyst, such as ferric sulfate can also be used. The resulting product is an aqueous dispersion of the doped electrically conductive polymer.

d. Highly-Fluorinated Acid Polymer

The highly-fluorinated acid polymer ("HFAP") can be any polymer which is highly-fluorinated and has acidic groups with acidic protons. The acidic groups supply an ionizable proton. In some embodiments, the acidic proton has a pKa of less than 3. In some embodiments, the acidic proton has a pKa of less than 0. In some embodiments, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group. In some embodiments, the acidic groups are selected from the group consisting of sulfonic acid groups, sulfonamide groups, and combinations thereof.

In some embodiments, the HFAP is at least 95% fluorinated; in some embodiments, fully-fluorinated.

In some embodiments, the HFAP is water-soluble. In some embodiments, the HFAP is dispersible in water. In some embodiments, the HFAP is organic solvent wettable. The term "organic solvent wettable" refers to a material which, when formed into a film, possesses a contact angle no greater than 60° C. with organic solvents. In some embodiments, wettable materials form films which are wettable by phenylhexane with a contact angle no greater than 55°. The methods for measuring contact angles are well known. In some embodiments, the wettable material can be made from a polymeric acid that, by itself is non-wettable, but with selective additives it can be made wettable.

Examples of suitable polymeric backbones include, but are not limited to, polyolefins, polyacrylates, polymethacrylates, polyimides, polyamides, polyaramids, polyacrylamides, polystyrenes, and copolymers thereof, all of which are highly-fluorinated; in some embodiments, fully-fluorinated.

In one embodiment, the acidic groups are sulfonic acid groups or sulfonimide groups. A sulfonimide group has the formula:

$$-SO_2-NH-SO_2-R$$

where R is an alkyl group.

In one embodiment, the acidic groups are on a fluorinated side chain. In one embodiment, the fluorinated side chains are selected from alkyl groups, alkoxy groups, amido groups, ether groups, and combinations thereof, all of which are fully fluorinated.

In one embodiment, the HFAP has a highly-fluorinated olefin backbone, with pendant highly-fluorinated alkyl sulfonate, highly-fluorinated ether sulfonate, highly-fluorinated ester sulfonate, or highly-fluorinated ether sulfonimide groups. In one embodiment, the HFAP is a perfluoroolefin having perfluoro-ether-sulfonic acid side chains. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the HFAP is homopolymer or copolymer of a fluorinated and partially sulfonated poly(arylene ether sulfone). The copolymer can be a block copolymer.

In one embodiment, the HFAP is a sulfonimide polymer having Formula IX:

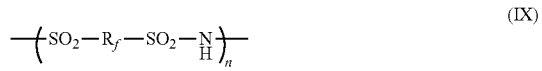
(IX)

where:

$R_f$ is selected from highly-fluorinated alkylene, highly-fluorinated heteroalkylene, highly-fluorinated arylene, and highly-fluorinated heteroarylene, which may be substituted with one or more ether oxygens; and n is at least 4.

In one embodiment of Formula IX, $R_f$ is a perfluoroalkyl group. In one embodiment, $R_f$ is a perfluorobutyl group. In one embodiment, $R_f$ contains ether oxygens. In one embodiment n is greater than 10.

In one embodiment, the HFAP comprises a highly-fluorinated polymer backbone and a side chain having Formula X:

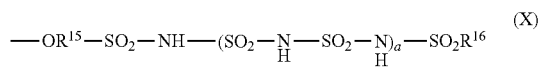
(X)

where:

$R^{15}$ is a highly-fluorinated alkylene group or a highly-fluorinated heteroalkylene group;

$R^{16}$ is a highly-fluorinated alkyl or a highly-fluorinated aryl group; and a is 0 or an integer from 1 to 4.

In one embodiment, the HFAP has Formula XI:

where:

$R^{16}$ is a highly-fluorinated alkyl or a highly-fluorinated aryl group;

c is independently 0 or an integer from 1 to 3; and n is at least 4.

The synthesis of HFAPs has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the HFAP also comprises a repeat unit derived from at least one highly-fluorinated ethylenically unsaturated compound. The perfluoroolefin comprises 2 to 20 carbon atoms. Representative perfluoroolefins include, but are not limited to, tetrafluoroethylene, hexafluoropropylene, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated perfluoroalkyl group of from 1 to about ten carbon atoms. In one embodiment, the comonomer is tetrafluoroethylene.

In one embodiment, the HFAP is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any highly-fluorinated colloid-forming polymeric material having acidic protons can be used. Some of the polymers described hereinabove may be formed in non-acid form, e.g., as salts, esters, or sulfonyl fluorides. They will be converted to the acid form for the preparation of conductive compositions, described below.

In some embodiments, HFAP include a highly-fluorinated carbon backbone and side chains represented by the formula

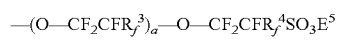

wherein $R_f^3$ and $R_f^4$ are independently selected from F, Cl or a highly-fluorinated alkyl group having 1 to 10 carbon atoms, a=0, 1 or 2, and $E^5$. In some cases $E^5$ can be a cation such as Li, Na, or K, and be converted to the acid form.

In some embodiments, the HFAP can be the polymers disclosed in U.S. Pat. No. 3,282,875 and in U.S. Pat. Nos. 4,358,545 and 4,940,525. In some embodiments, the HFAP comprises a perfluorocarbon backbone and the side chain represented by the formula

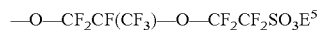

where $E^5$ is as defined above. HFAPs of this type are disclosed in U.S. Pat. No. 3,282,875 and can be made by copolymerization of tetrafluoroethylene (TFE) and the perfluorinated vinyl ether $CF_2=CF-O-CF_2CF(CF_3)-O-$

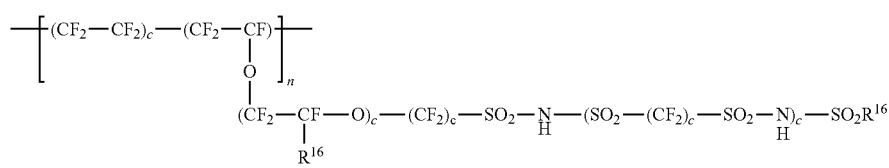
(XI)

$CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain —O—$CF_2CF_2SO_3E^5$, wherein $E^5$ is as defined above. This polymer can be made by copolymerization of tetrafluoroethylene (TFE) and the perfluorinated vinyl ether $CF_2$=CF—O—$CF_2CF_2SO_2F$, perfluoro(3-oxa-4-pentenesulfonyl fluoride) (POPF), followed by hydrolysis and further ion exchange as necessary.

One type of HFAP is available commericially as aqueous Nafion® dispersions, from E. I. du Pont de Nemours and Company (Wilmington, Del.).

e. Preparation of the Composite Dispersion

The first layer of the buffer bilayer is formed from an aqueous dispersion of conductive polymer doped with non-fluorinated polymeric acid and an HFAP. In the following discussion, this will be referred to as the composite dispersion.

The composite dispersion is prepared by first forming the doped conductive polymer and then adding the HFAP. The HFAP can be first dissolved or dispersed in an aqueous liquid.

The HFAP is present in an amount such that the acid equivalent ratio of HFAP to non-fluorinated polymeric acid is at least 0.2. In some embodiments, the ratio is no greater than 2.0.

In some embodiments, the pH is increased after the addition of the HFAP. The pH can be adjusted by treatment with cation exchange resins and/or base resins prior to additive addition. In some embodiments, the pH is adjusted by the addition of aqueous base solution. Cations for the base can be, but are not limited to, alkali metal, alkaline earth metal, ammonium, and alkylammonium. In some embodiments, alkali metal is preferred over alkaline earth metal cations.

In some embodiments, the dispersion of the doped conductive polymer is blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers.

Films made from the composite aqueous dispersions described herein, are hereinafter referred to as "the new films described herein". The films can be made using any liquid deposition technique, including continuous and discontinuous techniques. Continuous deposition techniques, include but are not limited to, spin coating, gravure coating, curtain coating, dip coating, slot-die coating, spray coating, and continuous nozzle coating. Discontinuous deposition techniques include, but are not limited to, ink jet printing, gravure printing, and screen printing.

3. Second Layer of the Buffer Bilayer

The second layer of the buffer bilayer comprises a metal selected from the group consisting of transition metals, Group 13 metals, Group 14 metals, and lanthanide metals. In some embodiments, the layer is a combination of two or more of these metals which are co-deposited. In some embodiments, the second layer comprises a metal selected from the group consisting of aluminum, molybdenum, vanadium, indium, tin, and lanthanide metals.

In some embodiments, the second layer comprises a metal selected from the group consisting of lanthanide metals (atomic numbers 57-71). In some embodiments, the metal is selected from Nd, Pm, Sm, Eu, Tb, and Tm. In some embodiments, the metal is Sm.

The second layer has a thickness of no greater than 20 nm. In some embodiments, the thickness is no greater than 10 nm. In some embodiments, the thickness is from 1 to 5 nm.

4. Formation of the Buffer Bilayer

In the following discussion, the conductive polymer and HFAP will be referred to in the singular. However, it is understood that more than one of either or both of these may be used.

The buffer bilayer is formed by first forming a layer of the doped electrically conductive polymer. A layer of lanthanide metal is then vapor deposited over the conductive polymer layer.

The first layer is formed by liquid deposition of an aqueous dispersion of the doped conductive polymer. Any liquid deposition technique can be used, including continuous and discontinuous techniques. Continuous deposition techniques, include but are not limited to, spin coating, gravure coating, curtain coating, dip coating, slot-die coating, spray coating, and continuous nozzle printing or coating. Discontinuous deposition techniques include, but are not limited to, ink jet printing, gravure printing, and screen printing.

In some embodiments, the first layer is formed from an aqueous dispersion having a pH in the range of 1.5 to 2.5. In some embodiments, the first layer is formed from an aqueous dispersion in which the pH has been increased to a range of greater than 2.5 to 7.

The first layer films thus formed are smooth and relatively transparent, and can have a conductivity in the range of $10^{-7}$ to $10^{-3}$ S/cm. The thickness of the first layer film can vary depending upon the intended use of the buffer bilayer. In some embodiments, the first layer has a thickness in the range of 10 nm to 200 nm; in some embodiments, 50 nm to 150 nm.

The second layer is then formed directly over the first layer by vapor deposition. As discussed above, the thickness of the second layer is in the range of 1 to 20 nm.

5. Electronic Devices

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electro-radiative properties. An electroactive layer material may emit radiation or exhibit a change in concentration of electron-hole pairs when receiving radiation.

As shown in FIG. 1, one embodiment of a device, 100, has an anode layer 110, a buffer bilayer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent to the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer bilayer 120 comprises the new buffer bilayer described above. Layer 121 is directly in contact with anode 110 and comprises (i) at least one electrically conductive polymer doped with at least one non-fluorinated polymeric acid and (ii) at least one highly-fluorinated acid polymer. Layer 122 is the second layer of the buffer bilayer and comprises a thin layer comprising a metal selected from the group consisting of transition metals, Group 13 metals, Group 14 metals, and lanthanide metals.

An optional layer, not shown, may be present between the buffer layer 120 and the electroactive layer 130. This layer may comprise hole transport materials. Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4"-tris(N,N-diphenyl-amino)-triphenylamine (TDATA); 4,4',4"-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. In some embodiments, polymers and copolymers of fluorene and triarylamines are used as hole transporting materials. It is also possible to obtain hole transporting polymers by doping hole transporting molecules such as those mentioned above into polymers such as polystyrene and polycarbonate. In some embodiments, the hole transport material can be doped with an electron acceptor material or an electron donor material.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material, Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, pyrene, perylene, rubrene, coumarin, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinolato)(para-phenyl-phenolato)aluminum(III) (BAIQ) and tris(8-hydroxyquinolato)aluminum ($Alq_3$); tetrakis(8-hydroxyquinolinato)zirconium; azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10- diphenylphenanthroline (DPA) and 2,9-dimethyl-4,7-diphenyl-1,10-phenanthroline (DDPA); and any one or more combinations thereof. In some embodiments, the electron transport material can be doped with an electron acceptor material or an electron donor material.

Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110 the hole transport layer 120, the electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; buffer bilayer 120, 50-2000 Å, in one embodiment 200-1000 Å; photoactive layer 130, 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Devices including the buffer bilayer described herein can have improved device lifetimes. In some embodiments, the new devices have better lifetimes and/or less loss of luminance in the beginning of device operation. The loss of luminance can be measured as T90, which is the time required to drop to 90% of the initial luminance at a given wavelength, or T80, which is the time required to drop to 80% of the initial luminance.

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

EXAMPLES

General Procedure

Device Fabrication

Glass substrates coated with 50 nm ITO (indium/tin oxide), purchased from Thin Film Devices Incorporated, had a sheet resistance of 50 ohms/square and 80% light transmission. The surface was pre-treated with UV/ozone for 10 minutes. This was spin-coated with an aqueous dispersion of the first buffer material and then baked at 140° C. in air for 7 minutes, to form the first buffer layer. The coating conditions were chosen so that the layer had a final thickness of 20 nm.

When a second buffer layer was present, it was formed by thermal evaporation of Sm metal in a vacuum chamber. The thickness of the Sm layer was controlled to be 2.5 nm. Care was taken to avoid any traces of oxygen in the deposition process. However, the Sm surface may be partially oxidized.

The buffer layer was top-coated in an inert chamber with a dilute toluene solution of a hole transport polymer which is a crosslinkable copolymer of a dialkylfluorene and triphenylamine. The coating had a 20 nm thickness after baking at 290° C. for 30 minutes. The baking is to remove solvent and to crosslink the polymer to be insoluble in the solvent of the next layer solution processing. After cooling, the substrates were spin-coated with an emissive layer solution containing 13:1 fluorescent host:blue fluorescent dopant, and subsequently heated at 140° C. for 15 minutes to remove solvent. The layer thickness was approximately 45 nm. The substrates were then masked and placed in a vacuum chamber. A 20 nm thick layer of ZrQ [tetrakis-(8-hydroxyquinoline)zirconium] as an electron transport layer was deposited by thermal evaporation, followed by a 0.5 nm layer of LiF and 150 nm aluminum cathode layer.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency (cd/A) of the device at a certain voltage is determined by dividing the electroluminescence radiance of the LED by the current density needed to run the device. The power efficiency (Lm/W) is the current efficiency divided by the operating voltage.

Comparative Example A

This example illustrates the performance of a device having a single buffer layer of doped conductive polymer without HFAP.

A device was made and tested according to the general procedure using poly(3,4-ethylenedioxythiophene) doped with polystyrenesulfonic acid ("PEDOT/PSSA") as the buffer layer. The PEDOT/PSSA used was Baytron-P A14083 from H. C. Starck, GmbH, Leverkusen, Germany.

The A14083 (Lot#HCD06P047) purchased from Starck contained 1.57 w. % solid. The solid was primarily PEDOT-PSSA having weight ratio of 1:6. The pH of A14083 is typically in the range of 1.7, which is quite acidic. The aqueous dispersion was diluted with deionized water and filtered through 0.22 um (micrometer) Millipore GP filters prior to spin-coating.

The results are given in Table 1.

Comparative Example B

This example illustrates the performance of a device having a buffer bilayer with a first layer of doped conductive polymer without HFAP.

A device was made and tested according to the general procedure with a buffer bilayer having PEDOT/PSSA as the first layer and Sm as the second layer. The PEDOT/PSSA used was Baytron-P A14083, which was treated as described in Comparative Example A. The results are given in Table 1.

Comparative Example C

This example illustrates the performance of a device having a single buffer layer of doped conductive polymer with HFAP.

A device was made and tested according to the general procedure with a single buffer layer of PEDOT/PSSA and an HFAP which was a copolymer of tetrafluoroethylene ("TFE") and 3,6-dioxa-4-methyl-7-octenesulfonic acid ("PSEPVE").

The TFE/PSEPVE used for the blend is a 12.0% (w/w) aqueous colloidal dispersion of TFE/PSEPVE having A 25% (w/w) dispersion of TFE/PSEPVE was made using a procedure similar to the procedure in U.S. Pat. No. 6,150,426, Example 1, Part 2, except that the temperature was approximately 270° C. The TFE/PSEPVE dispersion was diluted with water to form a 12.0% (w/w) dispersion with an acid equivalent (EW) of 1000. The EW means weight in grams of the polymer per one sulfonic acid group.

8.5501 g of the TFE/PSEPVE™ were slowly added to 34.99 g A14083, which had been treated as described in Comparative Example A. The resulting dispersion had a pH of 1.5 and contained 3.6 wt % solid. The equivalent ratio of TFE/PSEPVE to PSSA was 0.4. The "equivalent ratio" as used herein, is intended to mean the ratio of the number of acid equivalents of TFE/PSEPVE to the number of acid equivalents of PSSA. The PEDOT/PSSA+TFE/PSEPVE™ dispersion was spin-coated onto ITO to form a single buffer layer.

Example 1

This example illustrates the performance of a device having a buffer bilayer with a first layer of doped conductive polymer with HFAP as described in Comparative Example C and a second layer of Sm.

A device was made and tested according to the general procedure with a buffer bilayer. The first layer was a layer of PEDOT/PSSA+TFE/PSEPVE, as described in Comparative Example C. The second layer was a layer of Sm. The device data shown in Table 1 clearly indicate that the blue-emissive devices made with the buffer bilayer have much longer T90 and T50 lifetimes.

TABLE 1

Device Results

| Example | CE (cd/A) | CIEY | V (v) | T90 (h) | T50 (h) |
|---|---|---|---|---|---|
| Comp. A | 2.4 | 0.17 | 7.4 | 6 | 31 |
| Comp. B | 0.8 | 0.185 | 8.0 | 0 | 0 |
| Comp. C | 3.5 | 0.18 | 7.4 | 7 | 77 |
| Example 1 | 3.2 | 0.15 | 7.5 | 729 | 6500 |

All data @ 1000 nits,
CE = current efficiency;
CIEY = y color coordinate according to the C.I.E. chromaticity scale (Commision Internationale de L'Eclairage, 1931);
T90 (h) = time to 90% of initial luminance in hours at 25° C.;
T50 (h) = time to half of initial luminance in hours @ 25° C.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. An electronic device comprising an anode layer, a buffer bilayer, an electroactive layer, and a cathode layer, wherein the buffer bilayer comprises:
    a first layer comprising (i) at least one electrically conductive polymer doped with at least one non-fluorinated polymeric acid and (ii) at least one highly-fluorinated acid polymer, and
    a second layer comprising a layer of a metal selected from the group consisting of transition metals, Group 13 metals, Group 14 metals, and lanthanide metals,
and wherein the first layer of the buffer bilayer is directly in contact with the anode and the second layer of the buffer bilayer is directly over the first layer of the buffer bilayer.

2. The device of claim 1, wherein the electrically conductive polymer is selected from the group consisting of polythiophenes, poly(selenophenes), poly(tellurophenes), polypyrroles, polyanilines, polycyclic aromatic polymers, copolymers thereof, and combinations thereof.

3. The bilayer of claim 1, wherein the electrically conductive polymer is selected from the group consisting of a polyaniline, polythiophene, a polypyrrole, a polymeric fused polycyclic heteroaromatic, copolymers thereof, and combinations thereof.

4. The device of claim 3, wherein the electrically conductive polymer is selected from the group consisting of unsubstituted polyaniline, poly(3,4-ethylenedioxythiophene), unsubstituted polypyrrole, poly(thieno(2,3-b)thiophene), poly(thieno(3,2-b)thiophene), and poly(thieno(3,4-b)thiophene).

5. The bilayer of claim 1, wherein the non-fluorinated polymeric acid is selected from the group consisting of polystyrene sulfonic acid, poly(2-acrylamido-2-methyl-1-propanesulfonic acid), and mixtures thereof.

6. The device of claim 1, wherein the highly-fluorinated acid polymer is at least 95% fluorinated.

7. The device of claim 1, wherein the highly-fluorinated acid polymer is selected from a sulfonic acid and a sulfonimide.

8. The device of claim 1, wherein the highly-fluorinated acid polymer is a perfluoroolefin having perfluoro-ether-sulfonic acid side chains.

9. The device of claim 1, wherein the highly-fluorinated acid polymer is selected from the group consisting of a copolymer of 1,1-difluoroethylene and 2-(1,1-difluoro-2-(trifluoromethyl)allyloxy)-1,1,2,2-tetrafluoroethanesulfonic acid and a copolymer of ethylene and 2-(2-(1,2,2-trifluorovinyloxy)-1,1,2,3,3,3-hexafluoropropoxy)-1,1,2,2-tetrafluoroethanesulfonic acid.

10. The device of claim 1, wherein the highly-fluorinated acid polymer is selected from a copolymer of tetrafluoroethylene and perfluoro(3,6-dioxa-4-methyl-7-octenesulfonic acid), and a copolymer of tetrafluoroethylene and perfluoro (3-oxa-4-pentenesulfonic acid).

11. The device of claim 1, wherein the metal is selected from the group consisting of aluminum, molybdenum, vanadium, indium, tin, and lanthanide metals.

12. The device of claim 11, wherein the metal is selected from the group consisting of lanthanide metals.

13. The device of claim 12, wherein the metal is selected from the group consisting of Nd, Pm, Sm, Eu, Tb, and Tm.

14. The device of claim 1, wherein the second layer of the bilayer has a thickness of no greater than 20 nm.

15. The device of claim 1, wherein the second layer of the bilayer has a thickness no greater than 10 nm.

16. The device of claim 1, wherein the second layer of the bilayer has a thickness of 1 to 5 nm.

* * * * *